United States Patent
Gwon

(10) Patent No.: US 10,069,022 B2
(45) Date of Patent: Sep. 4, 2018

(54) SOLAR CELL AND METHOD FOR MANUFACTURING SAME

(71) Applicant: LG INNOTEK CO., LTD., Seoul (KR)

(72) Inventor: Jin Ho Gwon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 133 days.

(21) Appl. No.: 15/022,682

(22) PCT Filed: Sep. 17, 2014

(86) PCT No.: PCT/KR2014/008662
§ 371 (c)(1),
(2) Date: Mar. 17, 2016

(87) PCT Pub. No.: WO2015/041467
PCT Pub. Date: Mar. 26, 2015

(65) Prior Publication Data
US 2016/0268454 A1 Sep. 15, 2016

(30) Foreign Application Priority Data
Sep. 17, 2013 (KR) .......................... 10-2013-0111656

(51) Int. Cl.
*H01L 31/044* (2014.01)
*H01L 31/0224* (2006.01)
(Continued)

(52) U.S. Cl.
CPC ............ *H01L 31/022433* (2013.01); *H01L 31/022441* (2013.01); *H01L 31/0322* (2013.01);
(Continued)

(58) Field of Classification Search
CPC ........ H01L 31/00–31/078; Y02E 10/50–10/60
(Continued)

(56) References Cited

U.S. PATENT DOCUMENTS 6,323,056 B1 * 11/2001 Miyoshi ............... H01L 31/046
136/244
8,962,984 B2 2/2015 Jee
(Continued)

FOREIGN PATENT DOCUMENTS

CN 102194900 A 9/2011
CN 102844879 A 12/2012
(Continued)

OTHER PUBLICATIONS

Office Action dated Dec. 21, 2016 in Chinese Application No. 201480057453.6.
(Continued)

*Primary Examiner* — Bach T Dinh
(74) *Attorney, Agent, or Firm* — Saliwanchik, Lloyd & Eisenschenk

(57) ABSTRACT

The present invention comprises: a supporting substrate; a rear electrode layer disposed on the supporting substrate; a light absorption layer disposed on the rear electrode layer; a front electrode layer disposed on the light absorption layer; and a first penetrating groove penetrating the rear electrode layer and the light absorption layer, wherein the rear electrode layer and the light absorption layer are arranged so as to be stepped.

14 Claims, 7 Drawing Sheets

(51) Int. Cl.
*H01L 31/032* (2006.01)
*H01L 31/0352* (2006.01)
*H01L 31/0749* (2012.01)

(52) U.S. Cl.
CPC ............. *H01L 31/035272* (2013.01); *H01L 31/035281* (2013.01); *H01L 31/0749* (2013.01); *Y02E 10/541* (2013.01)

(58) Field of Classification Search
USPC ................................................ 136/243–265
See application file for complete search history.

(56) References Cited

U.S. PATENT DOCUMENTS

| | | | |
|---|---|---|---|
| 2008/0216895 A1* | 9/2008 | Aoki | ............... H01L 31/0322 136/265 |
| 2010/0126559 A1 | 5/2010 | Cunningham et al. | |
| 2010/0258167 A1 | 10/2010 | Chang et al. | |
| 2011/0023957 A1 | 2/2011 | Eberspacher et al. | |
| 2011/0214731 A1 | 9/2011 | Park | |
| 2011/0214791 A1 | 9/2011 | Park | |
| 2012/0199191 A1 | 8/2012 | Lim | |
| 2013/0008496 A1* | 1/2013 | Jee | ...................... H01L 31/0463 136/256 |

FOREIGN PATENT DOCUMENTS

| | | | |
|---|---|---|---|
| JP | 2007317879 A | | 12/2007 |
| KR | 20110047726 A | | 5/2011 |
| WO | WO2011119001 | * | 9/2011 |

OTHER PUBLICATIONS

Office Action dated Aug. 17, 2017 in Chinese Application No. 201480057453.6, along with its English translation.
International Search Report in International Application No. PCT/KR2014/008662, filed Sep. 17, 2014.

* cited by examiner

【Figure 1】
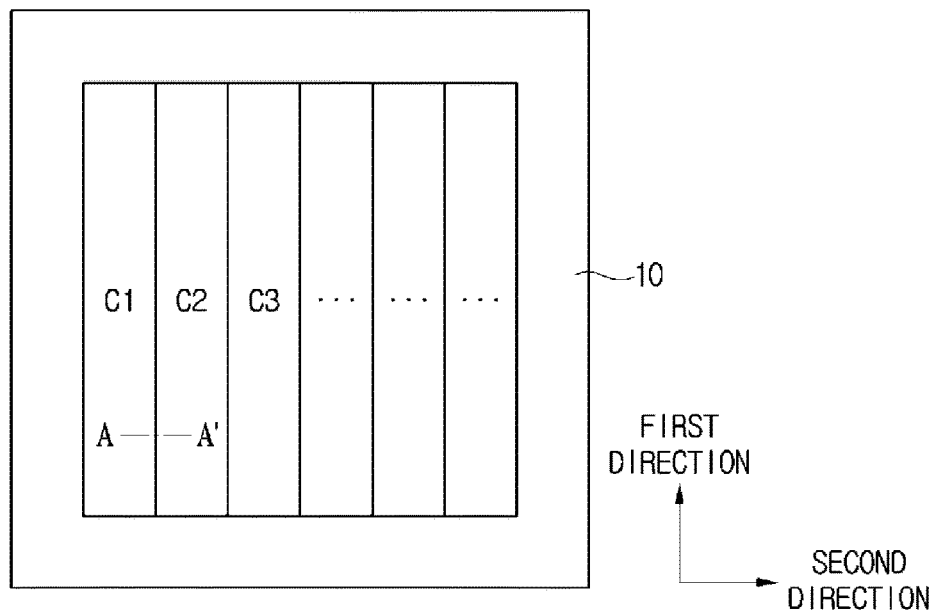
【Figure 2】
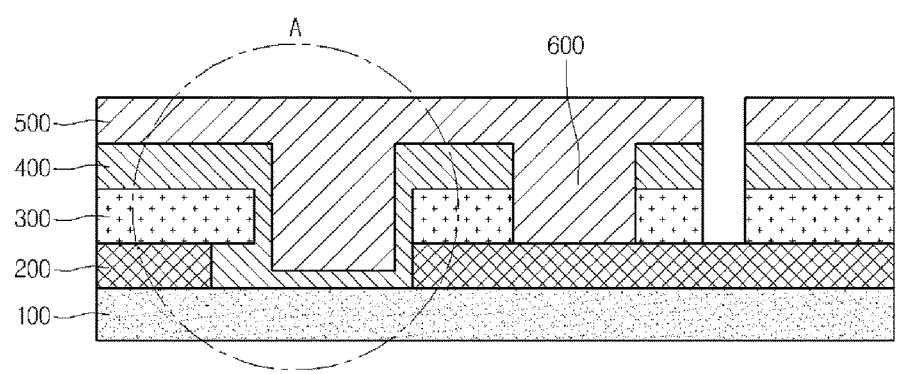

[Figure 3]
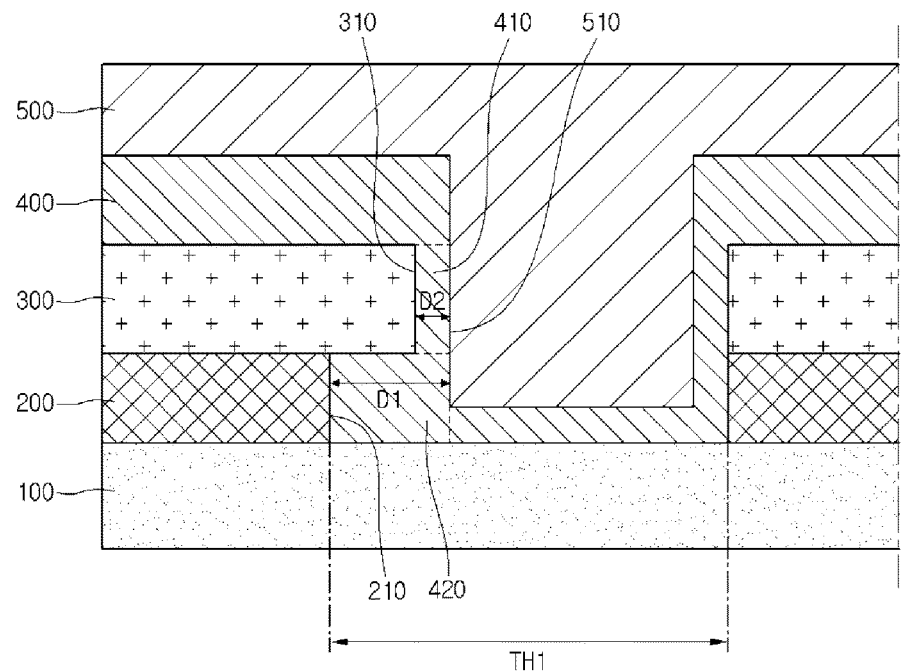
[Figure 4]
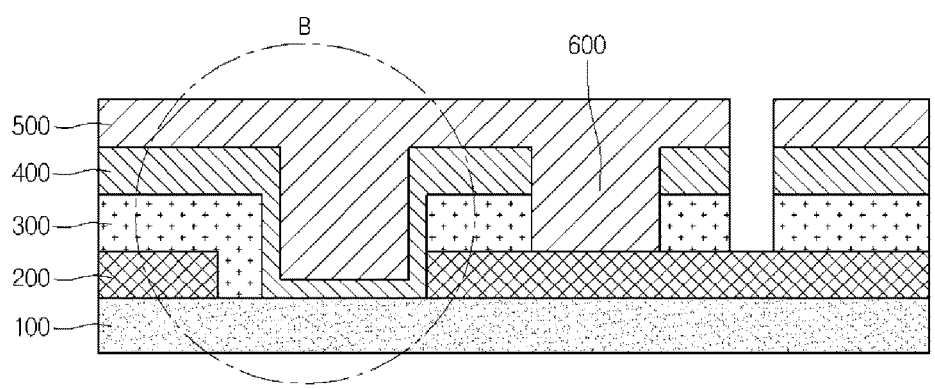

【Figure 5】
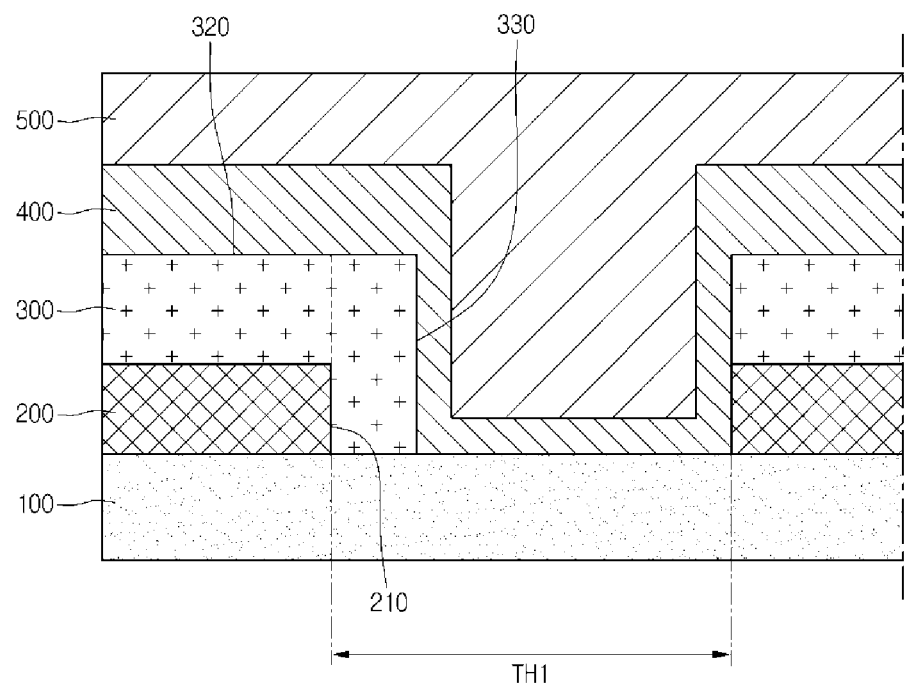
【Figure 6】
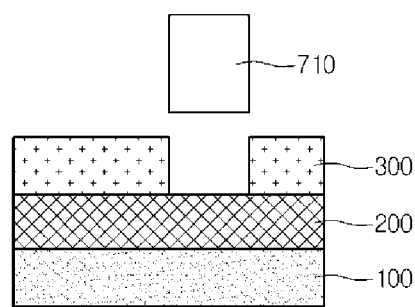

【Figure 7】
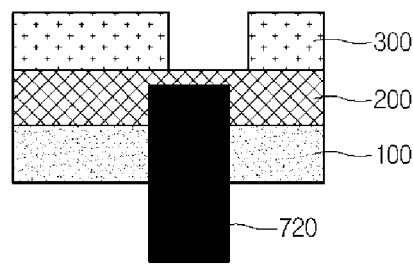
【Figure 8】
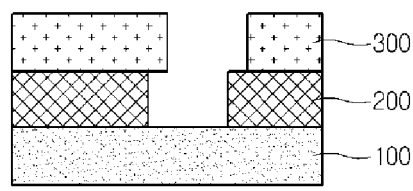
【Figure 9】

【Figure 10】
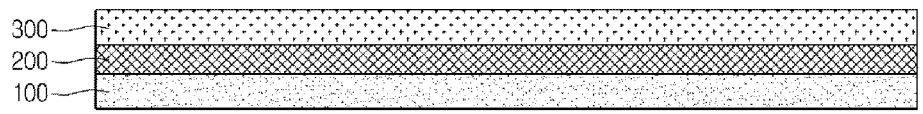
【Figure 11】
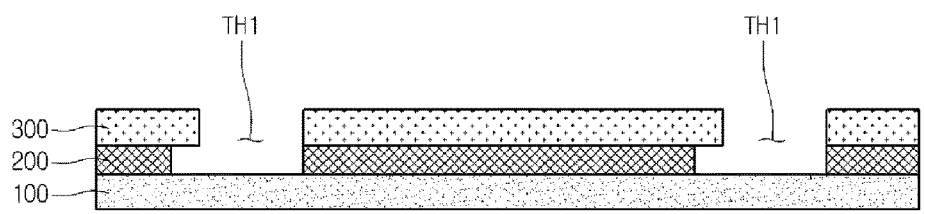
【Figure 12】
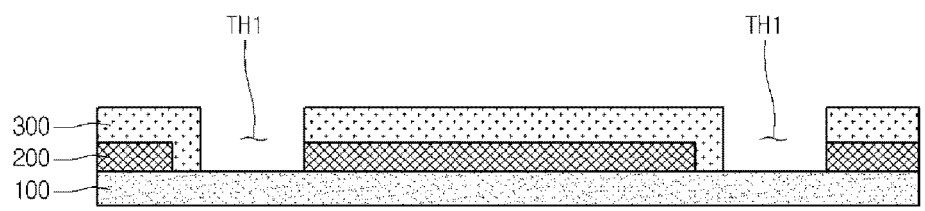
【Figure 13】
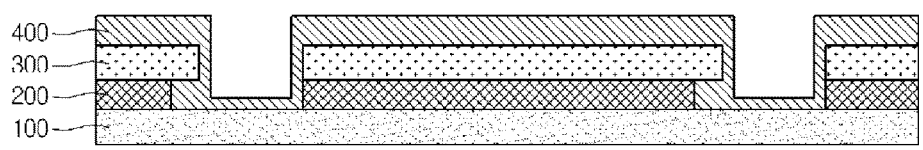

【Figure 14】
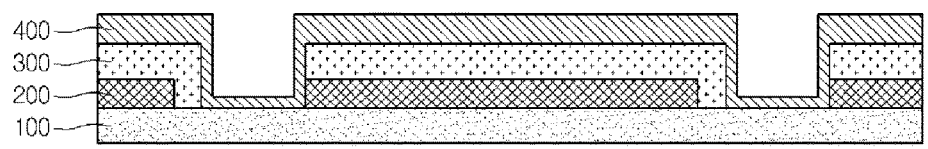
【Figure 15】
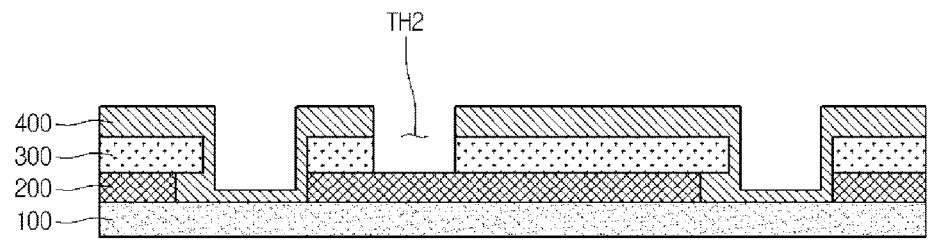
【Figure 16】
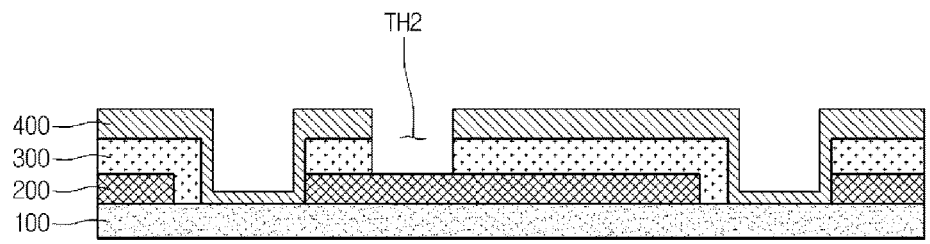
【Figure 17】
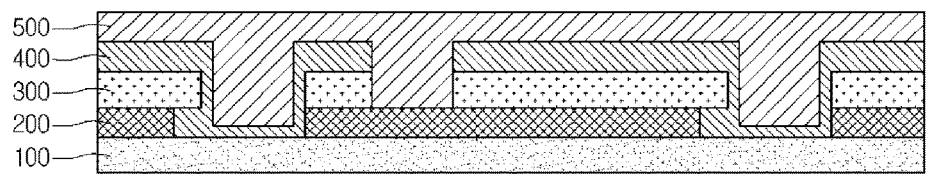

【Figure 18】
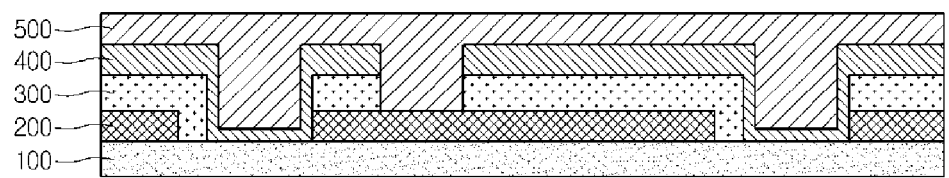
【Figure 19】
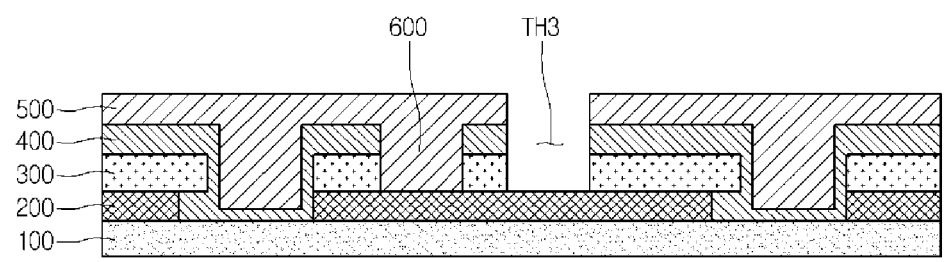
【Figure 20】
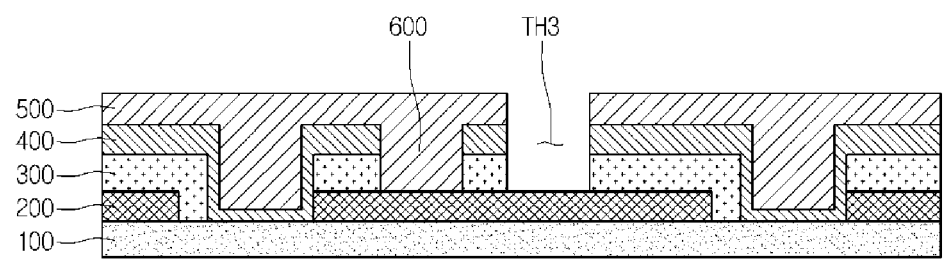

SOLAR CELL AND METHOD FOR MANUFACTURING SAME

CROSS-REFERENCE TO RELATED APPLICATION

This application is the U.S. national stage application of International Patent Application No. PCT/KR2014/008662, filed Sep. 17, 2014, which claims priority to Korean Application No. 10-2013-0111656, filed Sep. 17, 2013, the disclosures of each of which are incorporated herein by reference in their entirety.

TECHNICAL FIELD

The embodiment relates to a solar cell and a method for manufacturing the same.

BACKGROUND ART

A method of manufacturing a solar cell for solar light power generation is as follows. First, after preparing a substrate, a back electrode layer is formed on the substrate and patterned by a laser, thereby forming a plurality of back electrodes.

Then, a light absorbing layer, a buffer layer, and a high resistance buffer layer are sequentially formed on the back electrodes.

Then, a front electrode layer is formed on the buffer layer, such that a P-N junction is formed between the light absorbing layer and the front electrode layer.

In this case, a process of forming the light absorbing layer may be performed at high temperature. Thus, through holes patterned on the back electrode layer may be bent during the high-temperature process.

Thus, as the through holes are bent, a non-generation region, that is, a dead zone region is increased so that the efficiency of a solar cell may be deteriorated.

Therefore, there is required to provide a solar cell having a new structure capable of preventing the through hole formed on the back electrode layer from being bent and a method for manufacturing the same.

DISCLOSURE

Technical Problem

The embodiment provides a solar cell of a new structure having an improved photoelectric conversion effect and a method for manufacturing the same.

Technical Solution

According to a first embodiment, there is provided a solar cell which includes a support substrate; a back electrode layer on the support substrate; a light absorbing layer on the back electrode layer; a front electrode layer on the light absorbing layer; and a first through hole formed through the back electrode layer and the light absorbing layer, wherein a step difference is formed between the back electrode layer and the light absorbing layer.

According to a second embodiment, there is provided a solar cell which includes a support substrate; a back electrode layer on the support substrate; a light absorbing layer on the back electrode layer; a front electrode layer on the light absorbing layer; and a first through hole formed through the back electrode layer and the light absorbing layer, wherein a step difference is formed between the back electrode layer and the light absorbing layer, and wherein a side surface of the light absorbing layer protrudes with respect to a side surface of the back electrode layer in the first through hole.

According to a third embodiment, there is provided a solar cell which includes a support substrate; a back electrode layer on the support substrate; a light absorbing layer on the back electrode layer; a front electrode layer on the light absorbing layer; and a first through hole formed through the back electrode layer and the light absorbing layer, wherein the light absorbing layer makes contact with top and side surfaces of the back electrode layer.

According to an embodiment, there is provided a method of manufacturing a solar cell, which includes disposing a back electrode layer on a support substrate; disposing a light absorbing layer on the back electrode layer; forming a first through hole passing through the back electrode layer and the light absorbing layer; disposing a buffer layer on the light absorbing layer; and disposing a front electrode layer on the buffer layer, wherein the forming of the first through hole includes etching the light absorbing layer; and etching the back electrode layer, wherein a step difference is formed between the back electrode layer and the light absorbing layer.

Advantageous Effects

The solar cell according to an embodiment includes the first through hole passing through the back electrode and the light absorbing layer.

According to the related art, after the back electrode layer is formed, the first through hole is formed. Then, the light absorbing layer is formed on the back electrode layer in which the first through hole is formed.

However, since a process of forming the light absorbing layer is performed at high temperature, the first through hole is bent due to heat generated during the high-temperature process, so that a non-generation dead zone region is increased, thereby deteriorating the efficiency.

Thus, according to the solar cell of an embodiment, after all the back electrode layer and the light absorbing layer are formed, the first through hole passing through the back electrode layer and the light absorbing layer is formed, so that the first through hole may be prevented from being bent due to the high-temperature process of the light absorbing layer.

In addition, according to the solar cell of an embodiment, the step difference is formed between the back electrode layer and the light absorbing layer, or the light absorbing layer surrounds the side surface of the back electrode layer.

When the buffer layer is formed on the light absorbing layer after the back electrode layer and the light absorbing layer are all deposited and the first through hole is formed, the deposition thickness of the buffer layer is thinned, so that the front and back electrode layers are short circuited with each other in the first through hole, so a leakage current may be generated so that the efficiency may be deteriorated.

Thus, according to the solar cell of an embodiment, the back electrode layer and the light absorbing layer are formed to have the step difference between them. That is, the back electrode layer and the light absorbing layer are formed to have the step difference between them such that the edge surface of the light absorbing layer may protrude beyond the edge surface of the back electrode layer. Since the buffer layer is formed even in such a step difference part, that is, the step difference part between the back electrode layer and the light absorbing layer, the buffer layer placed between the back electrode layer and the front electrode layer may have a thickness larger than that of the buffer layer placed between the light absorbing layer and the front electrode layer.

Thus, due to the buffer layer having a thin thickness, the front and back electrode layers are prevented from making contact with each other, so that the efficiency loss due to the leakage current may be reduced.

In addition, according to the solar cell of an embodiment, the light absorbing layer may be formed while surrounding the back electrode layer. That is, the light absorbing layer may be formed on all the top and side surfaces of the back electrode layer.

Thus, even though the buffer layer is deposited to have a thin thickness, since the back electrode layer is protected by the light absorbing layer, the front and back electrode layers may be prevented from making contact with each other, so that the efficiency loss due to the leakage current may be reduced.

Thus, according to the solar cell of an embodiment, the first through hole may be prevented from being bent due to the high-temperature process of the light absorbing layer. As a result, even though the buffer layer is deposited to have a thin thickness, the front and back electrodes may be prevented from being short circuited with each other, so that the efficiency loss due to the leakage current may be reduced.

Therefore, the solar cell according to an embodiment may have improved photoelectric conversion efficiency.

DESCRIPTION OF DRAWINGS

FIG. 1 is a plan view showing a solar cell according to an embodiment.

FIG. 2 is a sectional view showing a solar cell according to a first embodiment.

FIG. 3 is an enlarged view of part A of FIG. 2.

FIG. 4 is a sectional view showing a solar cell according to a second embodiment.

FIG. 5 is an enlarged view of part B of FIG. 4.

FIGS. 6 to 8 are views illustrating a process of forming a first through hole.

FIGS. 9 to 20 are views illustrating a method of manufacturing a solar cell according to an embodiment.

BEST MODE

Mode for Invention

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the purpose of convenience or clarity. In addition, the size of elements does not utterly reflect an actual size.

Hereinafter, the embodiments of the present invention will be described in detail with reference to accompanying drawings.

A solar cell according to an embodiment will be described in detail with reference to FIGS. 1 to 8. FIG. 1 is a plan view showing a solar cell according to an embodiment. FIG. 2 is a sectional view showing a solar cell according to a first embodiment. FIG. 3 is an enlarged view of part A of FIG. 2. FIG. 4 is a sectional view showing a solar cell according to a second embodiment. FIG. 5 is an enlarged view of part B of FIG. 4. FIGS. 6 to 8 are views illustrating a process of forming a first through hole.

Referring to FIGS. 1 to 8, the solar cell according to an embodiment includes a support substrate 100, a back electrode layer 200, a light absorbing layer 300, a buffer layer 400, and a plurality of connecting parts 600.

The support substrate 100 has a plate shape, and supports the back electrode layer 200, the light absorbing layer 300, the buffer layer 400, the front electrode layer 500 and the connecting parts 600.

The support substrate 100 may include an insulator. The support substrate 100 may be a glass substrate, a plastic substrate, or a metal substrate. Meanwhile, the support substrate 100 may be a soda lime glass substrate. The support substrate 100 may be transparent. The support substrate 100 may be flexible or rigid.

The back electrode layer 200 is disposed on the support substrate 100. The back electrode layer 200 is a conductive layer. For example, the back electrode layer 200 may include metal such as molybdenum (Mo).

In addition, the back electrode layer 200 may include at least two layers. In this case, the layers may include the same metal or mutually different metals.

The light absorbing layer 300 includes group compounds. For instance, the light absorbing layer 300 may include the $Cu(In,Ga)Se_2$ (CIGS) crystal structure, the $Cu(In)Se_2$ crystal structure, or the $Cu(Ga)Se_2$ crystal structure.

The light absorbing layer 300 may have an energy bandgap in the range of about 1 eV to about 1.8 eV, but the embodiment is not limited thereto.

The light absorbing layer 300 is formed therein with first through holes TH1. In detail, the first through holes TH1 are formed by penetrating the back electrode layer 200 and the light absorbing layer 300.

A top surface of the support substrate 100 is exposed through the first through holes TH1. That is, the first through holes TH1 are open regions to expose the top surface of the support substrate 100. In addition, side surfaces of the back electrode layer 200 and the light absorbing layer 300 are exposed through the first through holes TH1. That is, edge surfaces of the back electrode layer 200 and the light absorbing layer 300 are exposed through the first through holes TH1.

When viewed in a plan view, the first through holes TH1 may have the shape extending in a first direction.

Each of the first through holes TH1 may have a width in the range of about 80 μm to about 200 μm, but the embodiment is not limited thereto.

The back electrode layer 200 is divided into a plurality of back electrodes by the first through holes TH1. That is, the plurality of back electrodes may be defined by the first through holes TH1.

The back electrodes are spaced apart from each other by the first through holes TH1. The back electrodes are arranged in the shape of a stripe.

Alternatively, the back electrodes may be arranged in the shape of a matrix. In this case, when viewed in a plan view, the first through holes TH1 may be provided in the shape of a lattice.

A step difference may be formed between the back electrode layer 200 and the light absorbing layer 300 by the first through holes TH1. In detail, an edge surface of the back electrode layer 200 is not disposed on the same plane as that of the light absorbing layer 300, but the edge surface of the back electrode layer 200 may cross that of the absorbing layer 300 so that the step difference is formed between them.

For example, as shown in FIGS. 2 and 3, a step difference may be formed between the back electrode layer 200 and the light absorbing layer 300 in a reverse stair shape. In detail, the side surface 310 of the light absorbing layer 300 may protrude toward the first through hole TH1 beyond the side surface 210 of the back electrode layer 200. That is, the edge surface 310 of the light absorbing layer 300 may protrude with respect to the edge surface 210 of the back electrode layer 200.

Alternatively, the back electrode layer 200 may be covered with the light absorbing layer 300. That is, the light absorbing layer 300 may surround the back electrode layer 200. For example, as shown in FIGS. 4 and 5, the light absorbing layer 300 may be disposed on the top and side surfaces of the back electrode layer 200 so that the light absorbing layer 300 may surround the back electrode layer 200. That is, a part 320 of the light absorbing layer 300 may make contact with the top surface of the back electrode layer and another part 330 of the light absorbing layer 300 may make contact with the side surface of the back electrode layer.

Thus, the light absorbing layer 300 may be arranged in a reverse-L shape and surround the top and side surfaces of the back electrode layer 200.

The buffer layer 400 is disposed on the light absorbing layer 300. The buffer layer 400 makes direct contact with the light absorbing layer 300.

The high resistance buffer layer (not shown) may be further disposed on the buffer layer 400. The high resistance buffer layer includes zinc oxide (i-ZnO) which is not doped with impurities. The energy bandgap of the high resistance buffer layer may be in the range of about 3.1 eV to about 3.3 eV.

Second through holes TH2 may be formed on the buffer layer 400. The second through holes TH2 are open regions to expose the top surface of the back electrode layer 200. When viewed in a plan view, portions of the second through holes TH2 may have a shape of extending in one direction. The width of the second through holes TH2 may be in the range of about 80 μm to about 200 μm.

The buffer layer 400 is defined as a plurality of buffer layers by the second through holes TH2. That is, the buffer layer 400 is divided into the buffer layers by the second through holes TH2.

The first through holes TH1 is partially filled with the buffer layer 400. In detail, the buffer layer 400 makes contact with the top surface of the light absorbing layer 300, the side surface of the light absorbing layer 300 exposed through the first through holes TH1 and the side surface of the back electrode layer 200, and is disposed in the first through holes TH1.

The front electrode layer 500 is provided on the buffer layer 400. In detail, the front electrode layer 600 is provided on the high resistance buffer layer. The front electrode layer 500 is a transparent conductive layer. In addition, the resistance of the front electrode layer 500 is greater than that of the back electrode layer 500.

The front electrode layer 500 includes oxide. For example, a material constituting the front electrode layer 500 may include aluminum doped zinc oxide (AZO), indium zinc oxide (IZO) or indium tin oxide (ITO).

The front electrode layer 500 is formed while being filled into the first through hole TH1. In detail, the front electrode layer 500 is formed on the top surface of the buffer layer 400 and the side surface of the buffer layer formed in the first through holes TH1.

Referring to FIGS. 2 and 3, the buffer layer 400 is interposed between the light absorbing layer 300 and the front electrode layer 500.

Due to the step difference between the back electrode layer 200 and the light absorbing layer 300, the buffer layer 400 provided in the first through hole TH1 may be divided into a first buffer layer 410 disposed between light absorbing layer 300 and the front electrode layer 500 and a second buffer layer 420 formed on the back electrode layer 200 and the front electrode layer 500. The first and second buffer layers 410 and 420 may be integrally formed.

In this case, in the first through hole TH1, a width of the second buffer layer 42 formed between the back electrode layer 200 and the front electrode layer 500 may be wider than that of the first buffer layer 410 formed between the light absorbing layer 300 and the front electrode layer 500.

In addition, due to the step difference between the back electrode layer 200 and the light absorbing layer 300, a first distance D1 between the side surface 210 of the back electrode layer 200 and the side surfaces 510 of the front electrode layer 500 in the first through hole TH1 may be longer than a second distance D2 between the side surface 310 of the light absorbing layer 300 and the side surface 510 of the front electrode layer 500 in the first through hole TH1.

In detail, the ratio (D1:D2) between the first distance D1 between the side surface 210 of the back electrode layer 200 and the side surfaces 510 of the front electrode layer 500 in the first through hole TH1 and the second distance D2 between the side surface 310 of the light absorbing layer 300 and the side surface 510 of the front electrode layer 500 in the first through hole TH1 may be in the range about 2:1 to about 200:1. That is, the first distance D1 is about 2 to 200 times of the second distance D2.

The front electrode layer 500 includes a connecting part 600 placed in the second through holes TH2.

A third through holes TH3 are formed in the buffer layer 400 and the front electrode layer 500. The third through holes TH3 may pass through a part or all of the buffer layer 400, the high resistance buffer layer and the front electrode layer 500. That is, the third through holes TH3 may expose the top surface of the back electrode layer 200.

The third through holes TH3 are adjacent to the second through holes TH2. In detail, the third through holes TH3 are provided beside the second through holes TH2. That is, when viewed in a plan view, the third through holes TH3 are formed beside the second through holes TH2 in parallel to the second through holes TH2. The third through holes TH3 may extend in the first direction.

The third through holes TH3 pass through the front electrode layer 500. In detail, the third through holes TH3 may pass through the light absorbing layer 300, the buffer layer 400 and/or a part of or the entire high resistance buffer layer.

The front electrode layer 500 is divided into a plurality of front electrodes by the third through holes TH3. That is, the front electrodes are defined by the third through holes TH3.

The front electrodes have a shape corresponding to that of the back electrodes. That is, the front electrodes are arranged in the shape of a stripe. Alternatively, the front electrodes may be arranged in the form of a matrix.

In addition, a plurality of solar cells C1, C2, . . . is defined by the third through holes TH3. In detail, the solar cells C1, C2, . . . are defined by the second and third through holes TH2 and TH3. That is, the solar cell according to an embodiment is divided into the solar cells C1 and C2 by the second and third through holes TH2 and TH3. In addition, the solar cells C1 and C2 are connected to each other in a second direction crossing the first direction. That is, a current may flow through the solar cells C1 and C2 in the second direction.

In other words, the solar cell panel 10 includes the support substrate 100 and the solar cells C1 and C2. The solar cells C1 and C2 are disposed on the support substrate 100 while being spaced apart from each other. In addition, the solar cells C1 and C2 are connected in series to each other through the connecting parts 600.

The connection parts 600 are provided inside the second through holes TH2. The connection parts 600 extend downward from the front electrode layer 500 and connected with the back electrode layer 200. For example, the connecting parts 600 extend from the first cell C1 and are connected to the back electrode of the second cell C2.

Accordingly, the connection parts 600 connect mutually adjacent cells to each other. In detail, the connection parts 600 connect the front and back electrodes included in each of the mutually adjacent solar cells.

The connecting part 600 is integrated with the front electrode layer 600. That is, a material constituting the connecting part 600 is identical to a material constituting the front electrode layer 500.

The solar cell according to an embodiment includes the first through hole passing through the back electrode and the light absorbing layer.

That is, according to the related art, after the back electrode layer is formed, the first through hole is formed. Then, the light absorbing layer is formed on the back electrode layer in which the first through hole is formed.

However, since a process of forming the light absorbing layer is performed at high temperature, the first through hole is bent due to heat generated during the high-temperature process, so that a non-generation dead zone region is increased, thereby deteriorating the efficiency.

Thus, according to the solar cell of an embodiment, after all the back electrode layer and the light absorbing layer are formed, the first through hole passing through the back electrode layer and the light absorbing layer is formed, so that the first through hole may be prevented from being bent due to the high-temperature process of the light absorbing layer.

In addition, according to the solar cell of an embodiment, the step difference is formed between the back electrode layer and the light absorbing layer, or the light absorbing layer surrounds the side surface of the back electrode layer.

When the buffer layer is formed on the light absorbing layer after the back electrode layer and the light absorbing layer are all deposited and the first through hole is formed, the deposition thickness of the buffer layer is thinned, so that the front and back electrode layers are short circuited with each other in the first through hole, so a leakage current may be generated so that the efficiency may be deteriorated.

Thus, according to the solar cell of an embodiment, the back electrode layer and the light absorbing layer are formed to have the step difference between them. That is, the back electrode layer and the light absorbing layer are formed to have the step difference between them such that the edge surface of the light absorbing layer may protrude beyond the edge surface of the back electrode layer. Since the buffer layer is formed even in such a step difference part, that is, the step difference part between the back electrode layer and the light absorbing layer, the buffer layer placed between the back electrode layer and the front electrode layer may have a thickness larger than that of the buffer layer placed between the light absorbing layer and the front electrode layer.

Thus, due to the buffer layer having a thin thickness, the front and back electrode layers are prevented from making contact with each other, so that the efficiency loss due to the leakage current may be reduced.

In addition, according to the solar cell of an embodiment, the light absorbing layer may be formed while surrounding the back electrode layer. That is, the light absorbing layer may be formed on all the top and side surfaces of the back electrode layer.

Thus, even though the buffer layer is deposited to have a thin thickness, since the back electrode layer is protected by the light absorbing layer, the front and back electrode layers may be prevented from making contact with each other, so that the efficiency loss due to the leakage current may be reduced.

Thus, according to the solar cell of an embodiment, the first through hole may be prevented from being bent due to the high-temperature process of the light absorbing layer. As a result, even though the buffer layer is deposited to have a thin thickness, the front and back electrodes may be prevented from being short circuited with each other, so that the efficiency loss due to the leakage current may be reduced.

Therefore, the solar cell according to an embodiment may have improved photoelectric conversion efficiency.

Hereinafter, the disclosure will be described in more detail with reference to embodiments. The embodiments are illustrative purpose only for describing the disclosure in detail. Therefore, the disclosure is not limited to following embodiments.

Embodiment

A back electrode layer including molybdenum was formed on a glass or plastic support substrate.

Then, a light absorbing layer was formed on the back electrode layer and a first through hole passing through the back electrode layer and the light absorbing layer was formed.

Then, a buffer layer was formed on the top surface of the light absorbing layer and a part of the first through hole.

In this case, as shown in FIG. 2, a step difference was formed between the light absorbing layer and the back electrode layer such that an edge surface of the light absorbing layer protrudes beyond an edge surface of the back electrode layer.

Next, while controlling the distance D1 between the back and front electrode layers and the distance D2 between the light absorbing layer and the front electrode layer, the loss Isc due to a leakage current was measured.

Result

The loss Isc due to the leakage current was confirmed by controlling the distances D1 and D2 and the results are shown in following Table 1.

TABLE 1

| D1(nm) | D2(nm) | D1/D2 | Isc Loss | Processing possibility |
|---|---|---|---|---|
| 100 | 100 | 1 | 0.5000% | Possible |
| 200 | 100 | 2 | 0.05000% | Possible |
| 500 | 100 | 5 | 0.0010% | Possible |
| 1000 | 100 | 10 | 0.0000% | Possible |

TABLE 1-continued

| D1(nm) | D2(nm) | D1/D2 | Isc Loss | Processing possibility |
|---|---|---|---|---|
| 5000 | 100 | 50 | 0.0000% | Possible |
| 10000 | 100 | 100 | 0.0000% | Possible |
| 20000 | 100 | 200 | 0.0000% | Efficiency deterioration due to increase of dead zone |
| 50 | 50 | 1 | 1.0000% | Possible |
| 100 | 50 | 2 | 0.0500% | Possible |
| 500 | 50 | 10 | 0.0005% | Possible |
| 1000 | 50 | 20 | 0.0000% | Possible |
| 5000 | 50 | 100 | 0.0000% | Possible |
| 10000 | 50 | 200 | 0.0000% | Possible |
| 20000 | 50 | 400 | 0.0000% | Efficiency deterioration due to increase of dead zone |

Referring to Table 1, when the ratio (D1/D2) between D1 and D2 is in the range of 2 to 200, it may be understood that the loss due to the leakage current is prevented without increasing the dead zone.

That is, even though the buffer layer is deposited on the step difference part or the light absorbing layer is formed while surrounding the back electrode layer, and the first through hole is formed after the light absorbing layer is deposited, the leakage current loss due to the buffer layer having a thin thickness may be prevented.

Thus, the solar cell according to an embodiment may prevent the efficiency from being deteriorated so that the whole efficiency of the solar cell may be improved.

Hereinafter, a method of manufacturing a solar cell according to an embodiment will be described with reference to FIGS. 6 to 20. FIGS. 6 to 20 are views illustrating a method of manufacturing a solar cell according to an embodiment.

First, referring to FIG. 9, the back electrode layer 200 is formed on the support substrate 100.

Then, referring to FIG. 10, the light absorbing layer 300 is formed on the back electrode layer 200. The light absorbing layer 300 may be formed through a sputtering process or an evaporation scheme.

For example, the light absorbing layer 300 is formed by extensively using various schemes including a scheme of forming a Cu(In,Ga)Se$_2$ (CIGS) based-light absorbing layer 300 by simultaneously or separately evaporating Cu, In, Ga, and Se and a scheme of performing a selenization process after a metallic precursor film has been formed.

Regarding the details of the selenization process after the formation of the metallic precursor layer, the metallic precursor layer is formed on the back contact electrode 200 through a sputtering process employing a Cu target, an In target, or a Ga target.

Thereafter, the metallic precursor layer is subject to the selenization process so that the Cu(In,Ga)Se$_2$ (CIGS) based-light absorbing layer 300 is formed.

In addition, the sputtering process employing the Cu target, the In target, and the Ga target and the selenization process may be simultaneously performed.

Alternatively, a CIS or a CIG light absorbing layer 300 may be formed through a sputtering process employing only Cu and In targets or only Cu and Ga targets and the selenization process.

Then, referring to FIG. 11, the back electrode layer 200 and the light absorbing layer 300 are patterned to form the first through holes TH1. Thus, a plurality of back electrodes is formed on the support substrate 100.

In detail, referring to FIGS. 6 to 8, the first through holes TH1 may be formed through two-step etching process.

First, referring to FIG. 6, a through hole is formed in the light absorbing layer 300 by using a mechanical tool such as a needle 710.

Then, referring to FIG. 7, a through hole is formed in the back electrode layer by using a laser 720. That is, the through hole is formed at a position in the back electrode layer such that the through hole overlaps the through hole formed in the light absorbing layer.

Thus, as shown in FIG. 8, the first through holes TH1 passing through the back electrode layer 200 and the light absorbing layer 300 may be formed.

In this case, as shown in FIG. 11, the step difference between the back electrode layer 200 and the light absorbing layer 300 may be formed in the first through holes TH1. In detail, the edge surface of the light absorbing layer 300 protrudes beyond the edge surface of the back electrode layer so that the step difference may be formed.

Alternatively, as shown in FIG. 12, the light absorbing layer 300 may be formed while surrounding the side surface of the back electrode layer 200. In detail, the light absorbing layer 300 may be formed while surrounding the top and side surfaces of the back electrode layer 200.

The top surface of the support substrate 100 is exposed through the first through holes TH1 and the first through holes TH1 may have a width in the range of about 80 μm to about 200 μm.

Then, referring to FIG. 13, the CdS is deposited through a sputtering process or a chemical bath deposition (CBD), and the buffer layer 400 is formed.

Then, zinc oxide may be deposited on the buffer layer 400 through a deposition process to further form the high resistance buffer layer. The high resistance buffer layer may be formed by depositing diethylzinc (DEZ).

The high resistance buffer layer may be formed through a chemical vapor deposition (CVD) scheme, a metal organic chemical vapor deposition (MOCVD) scheme or an atomic layer deposition (ALD) scheme. Preferably, the high resistance buffer layer may be formed through the MOCVD scheme.

In this case, as shown in FIG. 13, the buffer layer 400 may be formed while filling the step difference between the back electrode layer 200 and the light absorbing layer 300.

Alternatively, as shown in FIG. 14, the buffer layer 400 may extend along the light absorbing layer 300.

Then, as shown in FIGS. 15 and 16, the light absorbing layer 300 and the buffer layer 400 are partially removed to form the second through holes TH2.

The second through holes TH2 may be formed by using a mechanical device such as a tip or a laser device.

For example, the light absorbing layer 300 and the buffer layer 400 may be patterned by using the tip having a width in the range of about 40 μm to about 180 μm. In addition, the second through holes TH2 may be formed by using the laser having a wavelength in the range of about 200 nm to about 600 nm.

In this case, the second through holes TH2 may have a width in the range of about 100 μm to about 200 μm. The second through holes TH2 expose a part of the top surface of the back electrode layer 200.

Then, referring to FIGS. 17 and 18, a transparent conductive material is deposited on the buffer layer 400 to form the front electrode layer 500.

The transparent conductive material may be deposited in inert gas atmosphere having no oxygen to form the front electrode layer 500. In detail, the front electrode layer 500 may be formed by depositing zinc oxide doped with aluminum (Al) in inert gas atmosphere having no oxygen.

The step of forming the front electrode layer may be performed by depositing zinc oxide doped with aluminum (Al) in inert gas atmosphere having no oxygen through an RF sputtering scheme such as a deposition scheme employing ZnO targets or a reactive sputtering scheme employing Zn targets, so that the front electrode layer is formed.

The front electrode layer 500 makes contact with the back electrode layer 200 exposed through the second through holes TH2.

Referring to FIGS. 19 and 20, third through holes TH3 are formed by removing parts of the light absorbing layer 300, the buffer layer 400 and the high resistance buffer layer 500. Thus, a plurality of front electrodes, and the first cell C1, the second cell C2, and the third cells C3 are defined by patterning the front electrode layer 500. Each of the third through holes TH3 may have a width in the range of about 80 μm to about 200 μm.

As described above, the solar cell according to an embodiment includes the first through hole passing through the back electrode layer and the light absorbing layer.

That is, according to the related art, after the back electrode layer is formed, the first through hole is formed. Then, the light absorbing layer is formed on the back electrode layer in which the first through hole is formed. However, since a process of forming the light absorbing layer is performed at high temperature, the first through hole is bent due to heat generated during the high-temperature process, so that a non-generation dead zone region is increased, thereby deteriorating the efficiency.

Thus, according to the solar cell of an embodiment, after all the back electrode layer and the light absorbing layer are formed, the first through hole passing through the back electrode layer and the light absorbing layer is formed, so that the first through hole may be prevented from being bent due to the high-temperature process of the light absorbing layer.

In addition, according to the solar cell of an embodiment, the step difference is formed between the back electrode layer and the light absorbing layer, or the light absorbing layer surrounds the side surface of the back electrode layer.

When the buffer layer is formed on the light absorbing layer after the back electrode layer and the light absorbing layer are all deposited and the first through hole is formed, the deposition thickness of the buffer layer is thinned, so that the front and back electrode layers are short circuited with each other in the first through hole, so a leakage current may be generated so that the efficiency may be deteriorated.

Thus, according to the solar cell of an embodiment, the back electrode layer and the light absorbing layer are formed to have the step difference between them. That is, the back electrode layer and the light absorbing layer are formed to have the step difference between them such that the edge surface of the light absorbing layer may protrude beyond the edge surface of the back electrode layer. Since the buffer layer is formed even in such a step difference part, that is, the step difference part between the back electrode layer and the light absorbing layer, the buffer layer placed between the back electrode layer and the front electrode layer may have a thickness larger than that of the buffer layer placed between the light absorbing layer and the front electrode layer.

Thus, due to the buffer layer having a thin thickness, the front and back electrode layers are prevented from making contact with each other, so that the efficiency loss due to the leakage current may be reduced.

In addition, according to the method of manufacturing a solar cell of an embodiment, the light absorbing layer may be formed while surrounding the back electrode layer. That is, the light absorbing layer may be formed on all the top and side surfaces of the back electrode layer.

Thus, even though the buffer layer is deposited to have a thin thickness, since the back electrode layer is protected by the light absorbing layer, the front and back electrode layers may be prevented from making contact with each other, so that the efficiency loss due to the leakage current may be reduced.

Thus, according to the solar cell of an embodiment, the first through hole may be prevented from being bent due to the high-temperature process of the light absorbing layer. As a result, even though the buffer layer is deposited to have a thin thickness, the front and back electrodes may be prevented from being short circuited with each other, so that the efficiency loss due to the leakage current may be reduced.

Therefore, the solar cell manufactured by the method of manufacturing a solar cell according to an embodiment may have improved photoelectric conversion efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a support substrate;
   a back electrode layer on the support substrate;
   a light absorbing layer on the back electrode layer;
   a buffer layer on the light absorbing layer;
   a front electrode layer on the buffer layer; and
   a first through hole formed through the back electrode layer and the light absorbing layer,
   wherein the buffer layer includes cadmium sulfide (CdS),
   wherein a step difference is formed between the back electrode layer and the light absorbing layer,
   wherein a side surface of the light absorbing layer protrudes with respect to a side surface of the back electrode layer in the first through hole,
   wherein a portion of the buffer layer and a portion of the front electrode layer are disposed in the first through hole,
   wherein the portion of the buffer layer directly makes contact with a top surface of the support substrate, both side surfaces of the back electrode layer, both side surfaces of the light absorbing layer, and a bottom surface of the light absorbing layer exposed through the first through hole;

wherein the portion of the buffer layer directly makes contact with an entire surface of the top surface of the support substrate exposed through the first through hole, and wherein the portion of the front electrode layer directly makes contact with a side surface of the buffer layer and a top surface of the buffer layer disposed in the first through hole.

2. The solar cell of claim 1, wherein the step difference between the back electrode layer and the light absorbing layer has a reverse stair shape.

3. The solar cell of claim 1, wherein the step difference between the back electrode layer and the light absorbing layer is filled with the buffer layer.

4. The solar cell of claim 1, wherein the buffer layer comprises:
   a first buffer layer between the light absorbing layer and the front electrode layer; and
   a second buffer layer between the back electrode layer and the front electrode layer.

5. The solar cell of claim 4, wherein a width of the second buffer layer is larger than a width of the first buffer layer.

6. The solar cell of claim 1, wherein, in the first through hole, a first distance (D1) between the side surface of the back electrode layer and a side surface of the front electrode layer is longer than a second distance (D2) between the side surface of the light absorbing layer and the side surface of the front electrode layer.

7. The solar cell of claim 6, wherein a ratio (D1: D2) between the first and second distances is in a range of about 2: 1 to about 200: 1.

8. A solar cell comprising
   a support substrate;
   a back electrode layer on the support substrate;
   a light absorbing layer on the back electrode layer;
   a buffer layer on the light absorbing layer;
   a front electrode layer on the buffer layer; and
   a first through hole formed through the back electrode layer and the light absorbing layer,
   wherein the buffer layer includes cadmium sulfide (CdS),
   wherein the light absorbing layer makes contact with top and side surfaces of the back electrode layer,
   wherein a portion of the buffer layer and a portion of the front electrode layer are disposed in the first through hole,
   wherein the portion of the buffer layer directly makes contact with a top surface of the support substrate, a side surface of the back electrode layer, and a side surface of the light absorbing layer exposed through the first through hole; and
   wherein the portion of the front electrode layer directly makes contact with a side surface of the buffer layer and a top surface of the buffer layer disposed in the first through hole.

9. The solar cell of claim 8, wherein the light absorbing layer has a reverse-L shape.

10. The solar cell of claim 1,
    wherein the buffer layer is disposed while filling the step difference between the back electrode layer and the light absorbing layer.

11. The solar cell of claim 8, wherein the buffer layer comprises:
    a first buffer layer between the light absorbing layer and the front electrode layer; and
    a second buffer layer between the back electrode layer and the front electrode layer.

12. The solar cell of claim 11, wherein a width of the second buffer layer is larger than a width of the first buffer layer.

13. The solar cell of claim 1, further comprising a second through hole formed through the light absorbing layer and the buffer layer and spaced apart from the first through hole,
    wherein a connection part extending downward from the front electrode layer is disposed in the second through hole.

14. The solar cell of claim 8, further comprising a second through hole formed through the light absorbing layer and the buffer layer and spaced apart from the first through hole,
    wherein a connection part extending downward from the front electrode layer is disposed in the second through hole.

* * * * *